United States Patent
Kyu et al.

(10) Patent No.: US 7,336,125 B2
(45) Date of Patent: Feb. 26, 2008

(54) POWER AMPLIFIER AND TRANSMITTER

(75) Inventors: Irei Kyu, Kokubunji (JP); Shigeki Koya, Kokubunji (JP); Satoshi Tanaka, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 156 days.

(21) Appl. No.: 11/356,005

(22) Filed: Feb. 17, 2006

(65) Prior Publication Data
US 2007/0008032 A1    Jan. 11, 2007

(30) Foreign Application Priority Data
Jul. 5, 2005    (JP)    ............................. 2005-195822

(51) Int. Cl.
*H03F 1/14*    (2006.01)

(52) U.S. Cl. .................... 330/51; 330/124 R; 330/295

(58) Field of Classification Search .................. 330/51, 330/124 R, 286, 295
See application file for complete search history.

(56) References Cited

U.S. PATENT DOCUMENTS 6,085,074 A * 7/2000 Cygan ......................... 330/295
6,128,479 A * 10/2000 Fitzpatrick et al. ........... 330/51
6,774,717 B2 * 8/2004 Hellberg ................. 330/124 R

OTHER PUBLICATIONS

"A New High Efficiency Power Amplifier for Modulated Waves" by W.H. Doherty. vol. 24, No. 9. pp. 1163-1182.

* cited by examiner

*Primary Examiner*—Khanh Van Nguyen
(74) *Attorney, Agent, or Firm*—Mattingly, Stanger, Malur & Brundidge, P.C.

(57) ABSTRACT

A 90-degree phase delay power divider part PSPD is connected to an input side of a carrier amplifier Amp1 and a peak amplifier Amp2, and a variable electric length power combiner VTL2 is connected to an output side thereof. A control signal Sig is applied through a control terminal Ctrl of the variable electric length power combiner VTL2, and adjustment is performed in correspondence to a carrier frequency band of a carrier signal RFs so that an electric length of the variable electric length power combiner VTL2 becomes nearly 90 degrees. As a result, an electric length of an output power combining circuit of a Doherty type amplifier can be made variable, and a power-added efficiency can be enhanced for a multi-band or broad band.

10 Claims, 11 Drawing Sheets

PAE VS FREQ

POWER AMPLIFIER AND TRANSMITTER

CLAIM OF PRIORITY

The present application claims priority from Japanese application JP 2005-195822 filed on Jul. 5, 2005, the content of which is hereby incorporated by reference into this application.

FIELD OF THE INVENTION

The present invention relates to a power amplifier, especially, a Doherty type amplifier and a transmitter using the same. Also, the invention relates to a power amplifier for performing highly efficiency linear power amplification, and more particularly to a power amplifier which is capable of performing broad-band high efficiency power amplification and which is suitable for being used in a transmitter which has a broad frequency band or a multi-band and which uses a transmitter system, such as a multi-channel modulation system or an OFDM system, having a large envelope amplitude fluctuation and requiring high linearity.

BACKGROUND OF THE INVENTION

A communication system, such as a multi-channel modulation system or an OFDM system, having a large envelope amplitude fluctuation has a large peak to average power ratio (PAPR). Hence, high efficiency is difficult to realize with most conventional power amplifiers. A Doherty type amplifier in which amplifiers operating at different bias points from one another are combined has been conventionally known as a method of solving this problem. Descriptions of the Doherty type amplifier may be found in the literature, for example, W. H. Doherty, "New high efficiency power amplifier for modulated waves", Proceeding of the IRE, Vol. 24, No. 9, pp. 1163 to 1182, (1936).

A brief review of the Doherty type amplifier follows. Firstly, a Doherty type amplifier relating to a prior art will be described with reference to FIGS. 14 to 18.

FIG. 14 is a structural diagram of a Doherty type amplifier relating to a prior art.

FIG. 15 is a signal waveform diagram illustrating typical operation of the Doherty type amplifier shown in FIG. 14.

FIG. 16 is a graphical representation showing a relationship between output power range and power added efficiency (PAE) in simulation results for the Doherty type amplifier shown in FIG. 14.

FIG. 17 is a graphical representation showing a relationship between frequency range and power added efficiency (PAE) in the simulation results for the Doherty type amplifier.

FIG. 18 is a schematic diagram showing operating points of a carrier amplifier and a peak amplifier provided in the Doherty type amplifier.

A basic structure of the Doherty type amplifier is shown in FIG. 14. That is to say, a first amplifier (carrier amplifier), and a second amplifier (peak amplifier) are connected in parallel with each other. The first amplifier operates irrespective of the amplitude of an input signal to produce an output signal corresponding to the amplitude of the input signal. The second amplifier operates when the amplitude level of the input signal is equal to or larger than a certain threshold to produce an output signal corresponding to the level of the amplitude of the input signal above the threshold. When the amplitude of the input signal is small, the carrier amplifier operates in a linear region. The above-mentioned threshold is set near the amplitude level of the input signal corresponding to saturation power of the carrier amplifier in this operating region. Then, when the amplitude of the input signal is larger than the threshold, the output voltage of the carrier amplifier is clipped and thus the output waveform of the output voltage is distorted. However, the peak amplifier operates and supplies a current to the load so as to compensate for the clipped portion. As a result, distortion is reduced and at the same time, high power efficiency is maintained. FIG. 15 shows an example of amplitudes of signal waveforms in this case. As shown in FIG. 16, the Doherty type amplifier can realize high power efficiency for a wide output range.

Hereinafter, the principle of the operation of the Doherty type amplifier will be described in more detail. In general, when the peak amplifier and the carrier amplifier are connected in parallel with each other, a load voltage increases with a current supplied from the peak amplifier. Thus, when viewed from the carrier amplifier side, the load resistance appears to increase, leading to lower power efficiency. In the Doherty type amplifier, a ¼-wavelength transmission line, TL2 in FIG. 14, is connected between an output terminal of the carrier amplifier and an output terminal of the peak amplifier. A load R connected to an output side of the peak amplifier appears to the carrier amplifier to be $Zo^2/R$ (where Zo is the characteristic impedance of the transmission line) due to the ¼-wavelength transmission line. Although the load voltage increases with a current supplied from the peak amplifier, however, when viewed from the carrier amplifier side, the load resistance seemingly decreases. As a result, the efficiency of the carrier amplifier increases. Here, since the phase of a signal from the carrier amplifier is delayed by 90 degrees due to the ¼-wavelength transmission line on the output side, it is necessary to delay the phase of a signal through the peak amplifier by 90 degrees on the input side. A ¼-wavelength transmission line, TL1 in FIG. 14, serves this purpose.

In order that the circuit shown in FIG. 14 may operate as the Doherty type amplifier, a bias voltage or current is set in a carrier amplifier Amp1 so that the carrier amplifier Amp1 operates as a Class B amplifier, and a bias voltage or current is set in a peak amplifier Amp2 so that the peak amplifier Amp2 operates as a Class C amplifier. FIG. 18 shows operating voltage bias conditions of the carrier amplifier Amp1 and the peak amplifier Amp2. An offset bias voltage having the same magnitude as that of the input voltage amplitude right before the carrier amplifier Amp1 is saturated is applied to the peak amplifier Amp2.

The Doherty type amplifier according to the above-mentioned prior art realizes the power distribution of the input and the phase delay of 90 degrees, using a ¼-wavelength transmission line. Also, the Doherty type amplifier realizes the impedance conversion and 90-degree phase delay for the carrier amplifier output and power combination with the peak amplifier output, using another ¼-wavelength transmission line. In this prior art, however, the Doherty type amplifier can perform neither of the phase delay of 90 degrees nor the impedance conversion at a frequency greatly different from the central frequency of the amplifier. Hence, the Doherty type amplifier can show a high efficiency effect only for a narrow frequency band centered about the frequency corresponding to the ¼ wavelength. When the power-added efficiency (PAE) at 12 dB backoff is plotted in the form of a graph against frequency, an inverted-V curve as shown in FIG. 17 is obtained. Thus, the PAE becomes maximum at a certain frequency, and decreases as the magnitude of frequency difference from the certain frequency increases.

The present invention has been conceived in order to solve the above-mentioned problems. It is an object of the present invention to make the electric length of the output power combining circuit of a Doherty type power amplifier variable to realize a high efficiency for a multi-band or broad band.

SUMMARY OF THE INVENTION

One of features of a Doherty type amplifier of the present invention is to use a variable electric length power combiner VLT2, which can be adjusted so that its electric length becomes nearly 90 degrees in correspondence to the operating frequency in a broad band or a plurality of bands, as a circuit for realizing output power combination.

In one embodiment, a circuit including a first series circuit, a second series circuit, and a third series circuit is comprised in the variable electric length power combiner VTL2. In this case, in the first series circuit, a transmission line TL2a having a length of L1a and a transmission line TL2b having a length of L1b are connected so that the total electric length becomes 90 degrees at the central frequency of a high carrier frequency band A. The second series circuit includes a switch Sw1 and a capacitor Cs1. The third series circuit includes a switch Sw2 and a capacitor Cs2. One terminal of the third series circuit is connected to a node between the switch Sw1 and the capacitor Cs1, and the other terminal thereof is grounded. Also, the second series circuit and the transmission line TL2a are connected in parallel with each other, and the switch Sw1 is connected to a node between a carrier amplifier Amp1 and the transmission line TL2a.

Then, when the carrier frequency band is a band A, a control signal Sig1 is applied to the switches Sw1 and Sw2 through a control terminal Ctrl to turn OFF the switches Sw1 and Sw2, respectively, thereby adjusting the electric length of the variable electric length power combiner VTL2 to become nearly 90 degrees for the central frequency of the band A. When the carrier frequency band is a band B having frequencies lower than those of the band A, a control signal Sig2 is applied to the switches SW1 and SW2, respectively, through the control terminal Ctrl to turn ON the switches SW1 and SW2, thereby adjusting the electric length to become nearly 90 degrees for the central frequency of the band B. Thus, the power added efficiencies in the respective cases are optimized.

In another embodiment, with respect to the structure of the Doherty type amplifier, the carrier amplifier Amp1 includes an FET element Mc, and a dc-block capacitor Cc1. A drain terminal, a source terminal, and a gate terminal of the FET element Mc are connected to a power source voltage terminal Vdc, a ground, and a bias voltage terminal Vgc, respectively. The dc-block capacitor Cc1 is connected between a 90-degree phase-shift power divider PSPD and the gate terminal of the FET element Mc. The peak amplifier Amp2 includes an FET element Mp and a dc-block capacitor Cp1. A drain terminal, a source terminal, and a gate terminal of the FET element Mp are connected to a power source voltage terminal Vdp, the ground, and a bias voltage terminal Vgp, respectively. The dc-block capacitor Cp1 is connected between the 90-degree phase-shift power divider PSPD and the gate terminal of the FET element Mp.

Then, with respect to the structure of the variable electric length power combiner VTL2, a first series circuit, a second series circuit, and a third series circuit are provided. In this connection, in the first series circuit, a transmission line TL2s having a length of L1a, and a transmission line TL2b having a length of L1b are connected to each other. The second series circuit includes an FET element Ms1, and a capacitor Cs1 connected to a source terminal of the FET element Ms1. The third series circuit includes an FET element Ms2, and a capacitor Cs2 connected to a source terminal of the FET element Ms2. One terminal of the third series circuit is connected to a source terminal of the FET element Ms1, and the other terminal thereof is grounded. Also, a drain terminal of the FET element Ms1 is connected to a node between the carrier amplifier Amp1 and the transmission line TL2a.

In addition, a capacitor Cp2 is connected to a drain terminal of an FET element Mp, and a capacitor Cb is provided between an output terminal OUT and the capacitor Cp2.

When the carrier frequency band is a band A, a control signal Sig1 is applied to the gate terminals of the FET elements Ms1 and Ms2, respectively, through the control voltage terminal Ctrl connected to the gate terminals of the FET elements Ms1 and Ms2 so that the FET elements Ms1 and Ms2 are turned OFF. On the other hand, when the carrier frequency band is a band B, which is lower in frequency than the band A, a control signal Sig2 is applied to the FET elements Ms1 and Ms2, respectively, so that the FET elements Ms1 and Ms2 are turned ON. Thus, the FET elements Ms1 and Ms2 are switched for operation so that the electric length of the variable electric length power combiner VTL2 becomes nearly 90 degrees in each of the case of the band A and the case of the band B.

In addition, instead of the FET elements, bipolar elements may be used in the carrier amplifier and the peak amplifier, respectively.

In yet another embodiment, the following method of realizing the variable electric length power combiner VTL2 is also expected. That is to say, two or more transmission lines TL21, TL22, . . . which are connected in parallel with one another are connected in series between the carrier amplifier Amp1 and the transmission line TL2b through the selection switches Sw1 and Sw2. As a result, the total length of the transmission lines TL21 and TL2b becomes a quarter wavelength corresponding to the central frequency of the carrier frequency band A, the total length of the transmission lines TL22 and TL2b becomes a quarter wavelength corresponding to the central frequency of the carrier frequency band B, and so forth. When transmission is made in the carrier frequency bands A, B, . . . , the selection switches Sw1 and Sw2 are switched, selecting from among the transmission lines TL21, TL22, . . . , for operation so that the electric length is kept nearest to 90 degrees. Thus, the power added efficiencies in the respective cases are optimized.

In an alternative embodiment, the following method of realizing the variable electric length power combiner VTL2 is conceived. That is to say, two or more transmission lines TL21, TL22, . . . having length ratios of 2 to the k-th power (k=1, 2, . . . ) are connected in series with one another, and having shunt FET elements Ms21, Ms22, . . . connected in parallel with each transmission line, respectively, are connected in series between the carrier amplifier Amp1 and the transmission line TL2b.

Control signals are applied to gate terminals of the shunt FET elements Ms21, Ms22, . . . through control terminals Ctrl1, Ctrl2, . . . , respectively, to turn ON or OFF the shunt FET elements Ms21, Ms22, etc., whereby the electric length between the output terminals of the carrier amplifier Amp1 and the peak amplifier Amp2 is kept nearest to 90 degrees in correspondence to the carrier frequency. As a result, the power added efficiencies in the respective cases are optimized.

A transmitter which can realize high power-added efficiency for a plurality of frequency bands by utilizing the above-mentioned power amplifier is conceived that has a 90-degree phase-shift power divider PSPD including a modulating part Mod, a time signal converting part FTC, an X signal path and a Y signal path. In this connection, the modulating part Mod modulates a signal D of a plurality of sub-channels into an amplitude signal A and a phase signal P. The time signal converting part FTC converts the amplitude signal A and the phase signal P into time base signals X and Y between which there is a phase difference of 90 degrees. Also, the X signal path and the Y signal path convert time signals from FTC part to a carrier frequency. For power amplification, PSPD generates 90-degree phase-different transmission signals centered at a wanted carrier frequency and input to the carrier amplifier Amp1 and the peak amplifier Amp2, respectively. The electric length of the variable electric length power combiner VTL2 is adjusted nearest to 90 degrees for the wanted carrier frequency. As a result, power-added efficiency may be optimized for the wanted carrier frequency.

In another embodiment of a transmitter according to this invention, high power-added efficiency can be realized for a plurality of frequency bands in a manner as will be described below. An X signal path, in which a communication pre-processing block PS, a modulating circuit Mod1, a digital-to-analog converter DAC1, a low-pass filter LPF1, a mixer Mix1, and a variable gain amplifier PGA1 are connected in series with one another, is provided on the input side of the carrier amplifier Amp1. In this connection, the modulating circuit Mod1 generates a first modulated signal having phase delay of 0 degree, from a digital signal. The digital-to-analog converter DAC1 converts the first modulated signal into an analog signal. The low-pass filter LPF1 suppresses spurious higher harmonic frequency components. The mixer Mix1 performs frequency conversion. Also, the variable gain amplifier PGA1 amplifies the level of its input signal up to a necessary output level. In addition, a Y signal path in which the communication preprocessing block PS, a modulating circuit Mod2, a digital-to-analog converter DAC2, a low-pass filter LPF2, a mixer Mix2, and a variable gain amplifier PGA2 are connected in series with one another is provided on the input side of the peak amplifier Amp2. In this connection, the modulating circuit Mod2 generates a second modulated signal having phase delay of 90 degrees, from a digital signal. The digital-to-analog converter DAC2 converts the second modulated signal into an analog signal. The low-pass filter LPF2 suppresses spurious higher harmonic frequency components. The mixer Mix2 performs frequency conversion. Also, the variable gain amplifier PGA2 amplifies the level of its input signal up to a necessary output level. In such a manner, the 90-degree phase-shift power divider PSPD is structured from an X signal path and a Y signal path.

Then, a local signal source SG for driving the mixers Mix1 and Mix2 may be provided with the following attributes so that the 90-degree phase-shift power divider PSPD may generate 90-degree phase-difference signals through the X signal path and the Y signal path. The frequency of the local signal source SG is adjusted accordingly to the carrier frequency. The 90-degree phase-shift power divider PSPD generates 90-degree phase-different transmission signals centered at the carrier frequency to input to the carrier amplifier Amp1 and the peak amplifier Amp2, respectively. Thus, the transmitter may be adjusted so that the electric length of the variable electric length power combiner VTL2 is kept nearest to 90 degrees for the wanted carrier frequency. As a result, the power-added efficiency may be optimized for the wanted carrier frequency.

As described above, the present invention provides the technique for realizing a broad-band Doherty type amplifier with a simple structure which can be applied to a broad carrier band or a plurality of carrier bands, and a transmitter using the same. In addition, in a system in which transmission lines needed for a high frequency band are partially shunted with one or a plurality of capacitors in a lower frequency band, the broad-band Doherty type amplifier can be miniaturized by 60 percent or more as compared with the case using a plurality of Doherty type amplifiers.

In the manner as described above, according to the present invention, the electric length of the output power combining circuit of the power amplifier can be made variable, and high power efficiency can be realized for a multi-band or broad band system.

DETAILED DESCRIPTION OF THE PREFERRED EMBODIMENTS

Firstly, an outline of a Doherty type power amplifier according to the present invention will be described in detail with reference to FIGS. 1 and 2.

Figure 1:
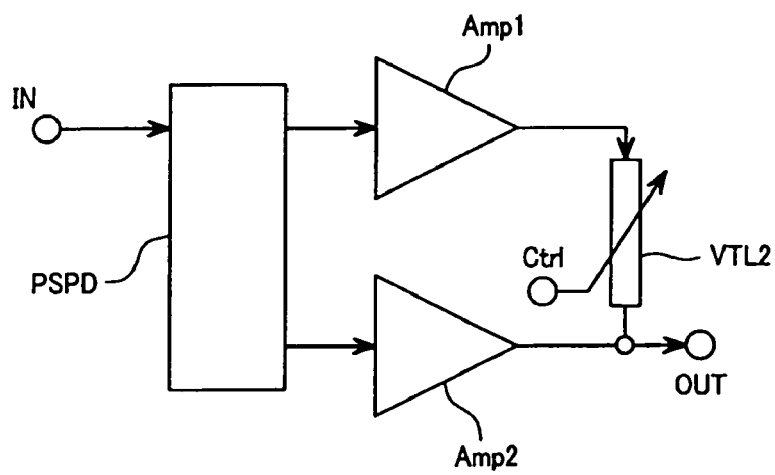
FIG. 1 is a circuit diagram showing an outline of a Doherty type amplifier according to the present invention.

FIG. 1 is a circuit diagram showing an outline of a Doherty type power amplifier according to the present invention.

Figure 2:
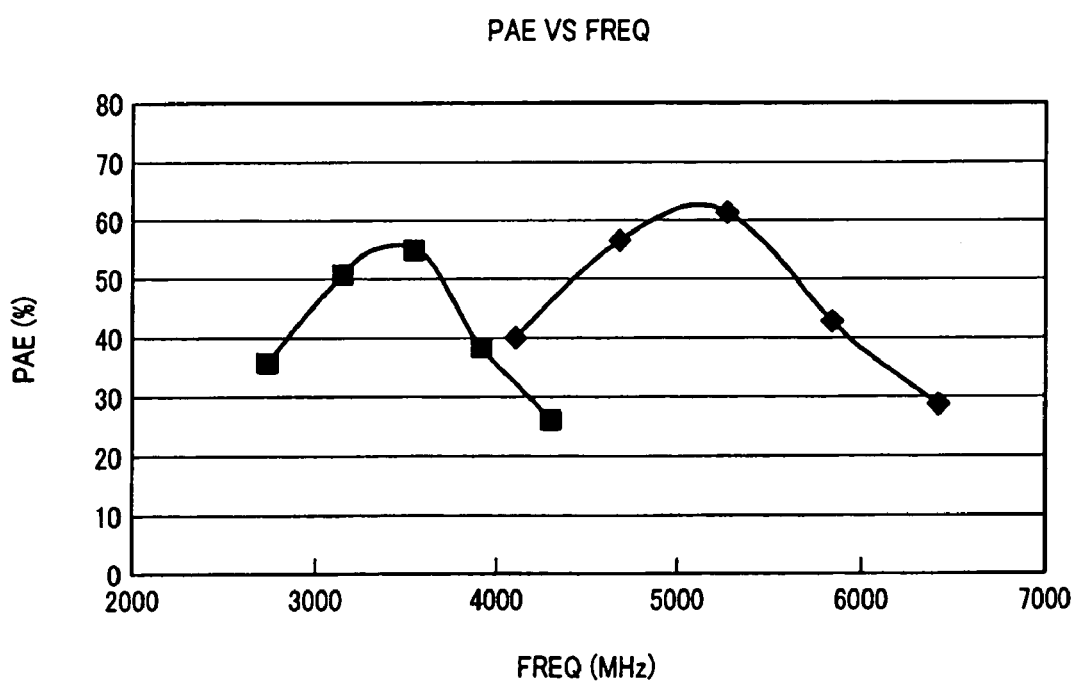
FIG. 2 is a graphical representation showing a relationship between frequency and PAE when the Doherty type amplifier of the present invention is used for both a band A and a band B.

FIG. 2 is a graphical representation showing a relationship between frequency and PAE when the Doherty type amplifier of the present invention is used for both a band A and a band B.

In the Doherty type amplifier of the present invention, as shown in FIG. 1, a carrier amplifier Amp1 and a peak amplifier Amp2 are connected in parallel between an input terminal IN and an output terminal OUT. A 90-degree phase-shift power divider PSPD is connected between the input sides of the carrier amplifier Amp1 and the peak amplifier Amp2, and a variable electric length power combiner VTL2 is connected between the output sides thereof. A transmission signal is inputted through the input terminal IN, and a carrier signal RFs and a 90-degree phase-delayed carrier signal RFsq which are obtained through the 90-degree phase-shift power divider PSPD are amplified by the carrier amplifier Amp1 and the peak amplifier Amp2, respectively. A composite output signal which is obtained through combination in the variable electric length power combiner VTL2 is outputted through the output terminal OUT. When the carrier frequency band is the band A, a control signal Sig1 is applied through a control terminal Ctrl, and adjustment is performed so that the electric length of the variable electric length power combiner VTL2 becomes nearly 90 degrees for the central frequency of the band A. On the other hand, when the carrier frequency band is the band B that is lower in frequency than band A, a control signal Sig2 is applied through the control terminal Ctrl, and adjustment is performed so that the electric length of the variable electric length power combiner VTL2 becomes nearly 90 degrees for the central frequency of the band B. As a result, the power added efficiencies (PAEs) in the respective cases are optimized.

At this time, as the simulation results in FIG. 2 show, the power added efficiencies (PAEs) at 12 dB backoff become maximum near the central frequencies of the frequency bands A and B, respectively.

Figure 18:
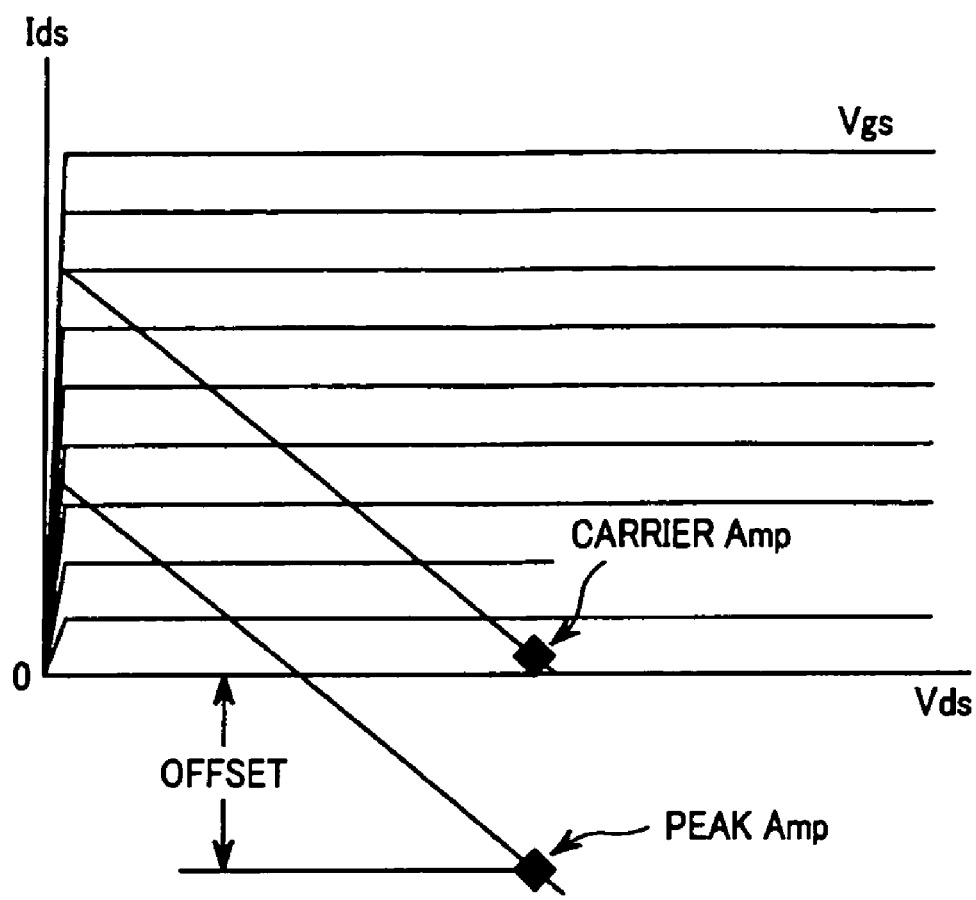
FIG. 18 is a diagram showing operating points of a carrier amplifier and a peak amplifier which are provided in the Doherty type amplifier.

Then, in order that the circuit shown in FIG. 1 may operate as a Doherty type amplifier, the bias voltage and current conditions shown in FIG. 18 are set so that the carrier amplifier Amp1 operates as a class B amplifier, and the peak amplifier Amp2 operates as a class C amplifier. The settings of the conditions under which each of the circuits operates in the Doherty type amplifier in the following embodiments are identical, if no further qualification is given.

First Embodiment

Next, a first embodiment according to the present invention will be described in detail with reference to FIGS. 3 to 6.

Figure 3:
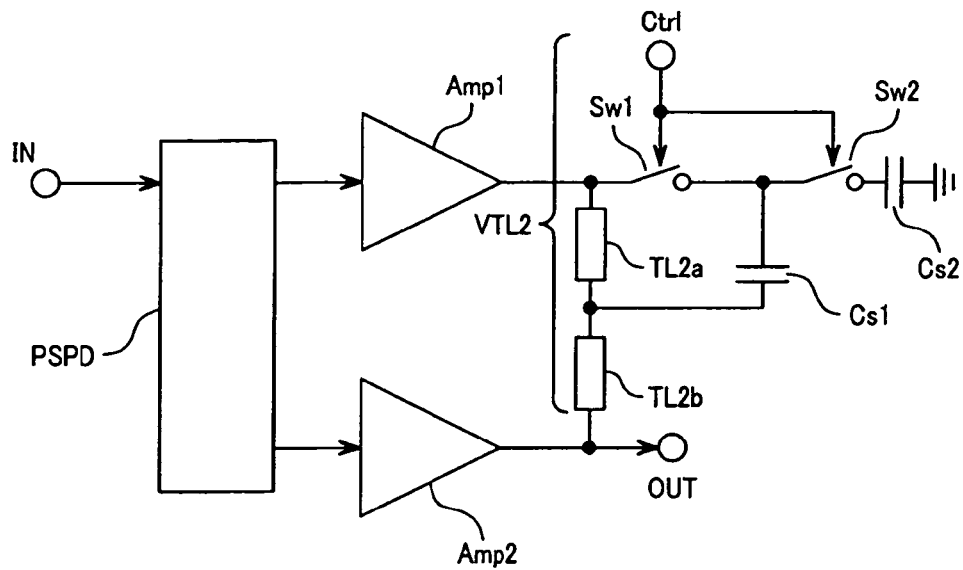
FIG. 3 is a circuit diagram of a Doherty type amplifier of a first embodiment of the present invention.

FIG. 3 is a circuit diagram of a Doherty type amplifier of the first embodiment of the present invention.

Figure 4:
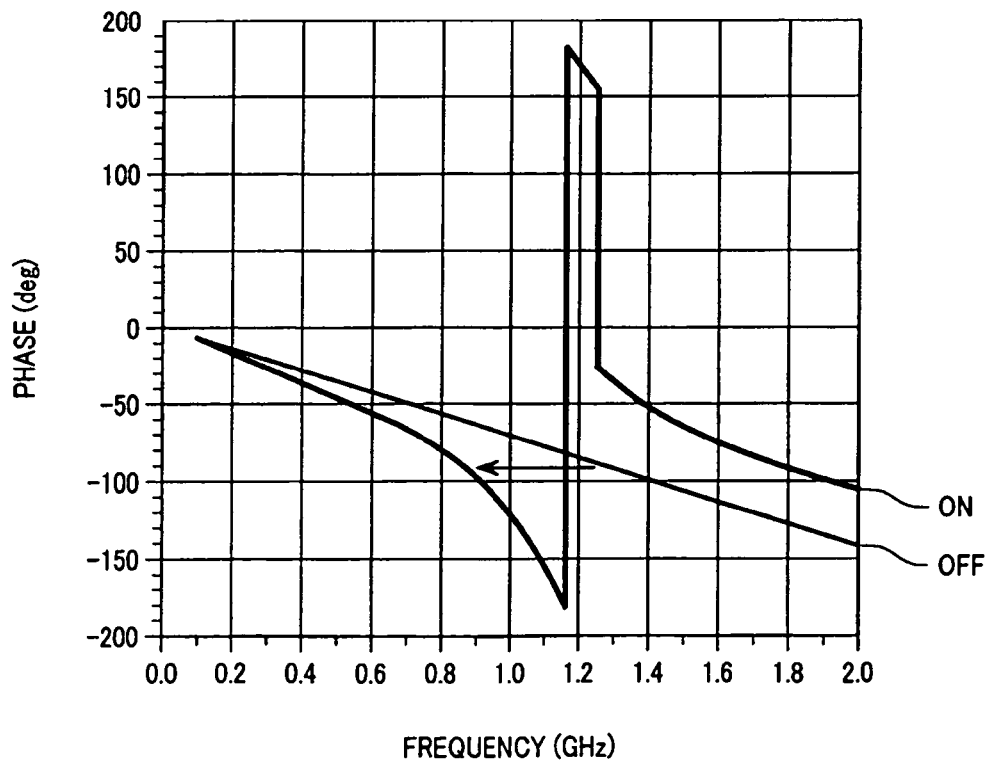
FIG. 4 is a graphical representation showing a relationship between frequency and phase delay of the output power combiner of the Doherty type amplifier of the first embodiment of the present invention.

FIG. 4 is a graphical representation showing a relationship between frequency and phase delay of the output power combiner of the Doherty type amplifier of the first embodiment of the present invention.

Figure 5:
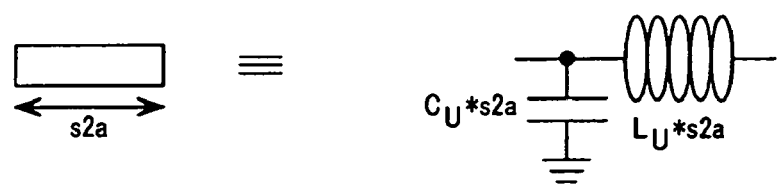
FIG. 5 is an equivalent circuit diagram of a transmission line.

FIG. 5 is an equivalent circuit diagram of a transmission line.

Figure 6:
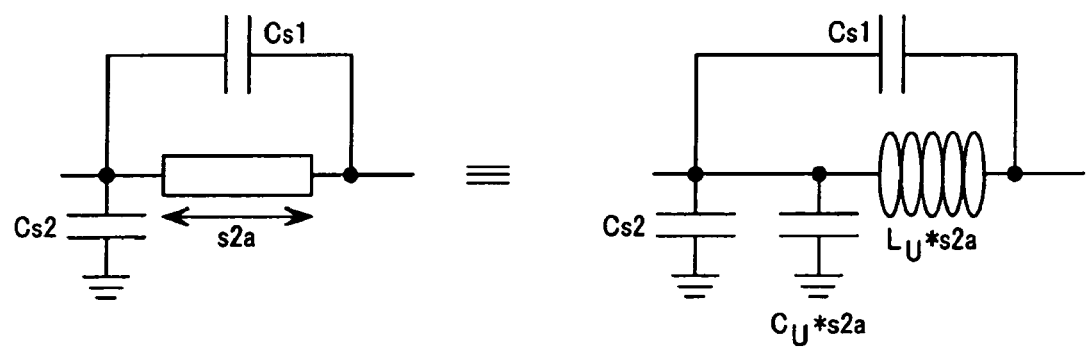
FIG. 6 is an equivalent circuit diagram of a variable electric length circuit of the first embodiment of the present invention.

FIG. 6 is an equivalent circuit diagram of a variable electric length circuit of the first embodiment of the present invention.

The first embodiment shows a more concrete circuit for realizing the variable electric length power combiner VTL2 shown in FIG. 1. The carrier amplifier Amp1, the peak amplifier Amp2, and the 90-degree phase-shift power divider PSPD are the same as those in the outline described with reference to FIG. 1.

Here, it is assumed that the band A is a higher frequency band, and the band B is a lower frequency band. Transmission lines TL2a and TL2b have lengths L1a and L1b, respectively, and the combined total electric length of the transmission lines TL2a and TL2b is 90 degrees at the central frequency of the band A. In a series circuit including the transmission lines TL2a and TL2b, the terminal on the transmission line TL2a side is connected to the carrier amplifier Amp1, and the terminal on the transmission line TL2b side is connected to the peak amplifier Amp2.

In a series circuit including a switch Sw1 and a capacitor Cs1, the terminal on the switch Sw1 side is connected to a node between the carrier amplifier Amp1 and the transmission line TL2a, and the terminal on the capacitor Cs1 side is connected to a node between the transmission lines TL2a and TL2b. One terminal of a capacitor Cs2 is grounded. The other terminal of the capacitor Cs2 is connected to a node between the switch Sw1 and the capacitor Cs1 through a switch Sw2. When the output carrier frequency falls within the band A, a control signal Sig1 is applied to the switches Sw1 and Sw2, respectively, through a control terminal Ctrl so that the switches Sw1 and Sw2 are turned OFF. On the other hand, when the output carrier frequency falls within the band B, a control signal Sig2 is applied to the switches Sw1 and Sw2, respectively, through the control terminal Ctrl so that the switches Sw1 and Sw2 are turned ON. Thus, the switches Sw1 and Sw2 are turned ON or OFF so that the electric length of the variable electric length power combiner VTL2 becomes nearly 90 degrees in each of the case of the band A and the case of the band B. FIG. 4 shows phase delay made by the variable electric length power combiner VTL2.

Hereinafter, the principle of the operation of the circuit will be described in brief with reference to equivalent circuit diagrams of the transmission line and the variable electric length power combiner VTL2.

When the length of the transmission line is much shorter than a wavelength, the transmission line can be approximated by an equivalent circuit shown in FIG. 5. When the unit length capacitance is designated by Cu, the unit length inductance is designated by Lu, and the line length is designated by s2a, the capacitance of the grounded capacitor shown in FIG. 5 becomes equal to $Cu*s2a$, and the series inductance becomes equal to $Lu*s2a$. The electric length of the transmission line is obtained from (Expression 1).

$$EL_H = sqrt((Cu*s2a)*(Lu*s2a)) \qquad \text{(Expression 1)}$$

When the switches Sw1 and Sw2 shown in FIG. 3 are turned ON, the transmission line can be approximated by an equivalent circuit shown in FIG. 6. Thus, the electric length changes as shown in (Expression 2) for the frequency.

$$EL_L = sqrt((Cu*s2a+Cs2)*(Lu*s2a)/(1-\omega^2*(Lu*s2a)*Cs1)) \qquad \text{(Expression 2)}$$

Expression 2 shows that the capacitance and the inductance equivalently increase. In order that the electric length in this case may become equal to that when the switches Sw1 and Sw2 are turned OFF, it is necessary to reduce the frequency. However, the fact that the electric lengths are merely equal to each other in both the cases does not fulfill the Doherty operation condition. That is to say, even when the switches Sw1 and Sw2 are in the ON state, it is necessary that the characteristic impedance is effectively identical to that when the switches Sw1 and Sw2 are in the OFF state and the following (Expression 3) must be true.

$$sqrt((Lu*s2a)/(Cu*s2a)) = sqrt((Lu*s2a)/(1-\omega^{2}* (Lu*s2a)*Cs1) /(Cu*s2a+Cs2)) \quad \text{(Expression 3)}$$

According to the first embodiment, the variable electric length power combiner VTL2 shown in FIG. 1, as shown in FIG. 3, is constituted by the transmission lines TL2a and TL2b, whose total electric length is 90 degrees at the central frequency of the band A, and the capacitors Cs1 and Cs2, with which the effective total electric length of the transmission lines TL2a and TL2b becomes 90 degrees at the central frequency of the band B. Thus, the switches Sw1 and Sw2 can be turned ON or OFF so that the electric length of the variable electric length power combiner VTL2 becomes 90 degrees in each of the band A and the band B, and the characteristic impedance in the case of the band B becomes nearly equal to that in the case of the band A. As a result, the electric length and the characteristic impedance of the output power combining circuit of the power amplifier including the carrier amplifier Amp1 and the peak amplifier Amp2 can be made nearly constant for two transmission signals having different frequency bands. Thus, the transmission signal in a multi-band transmission system or in a broad-band system can be amplified with a high efficiency. In addition, a structure is adopted in which switched capacitors are used instead of additional transmission lines. As a result, increase in circuit area may be greatly suppressed.

Second Embodiment

Next, a second embodiment according to the present invention will be described in detail with reference FIG. 7.

Figure 7:
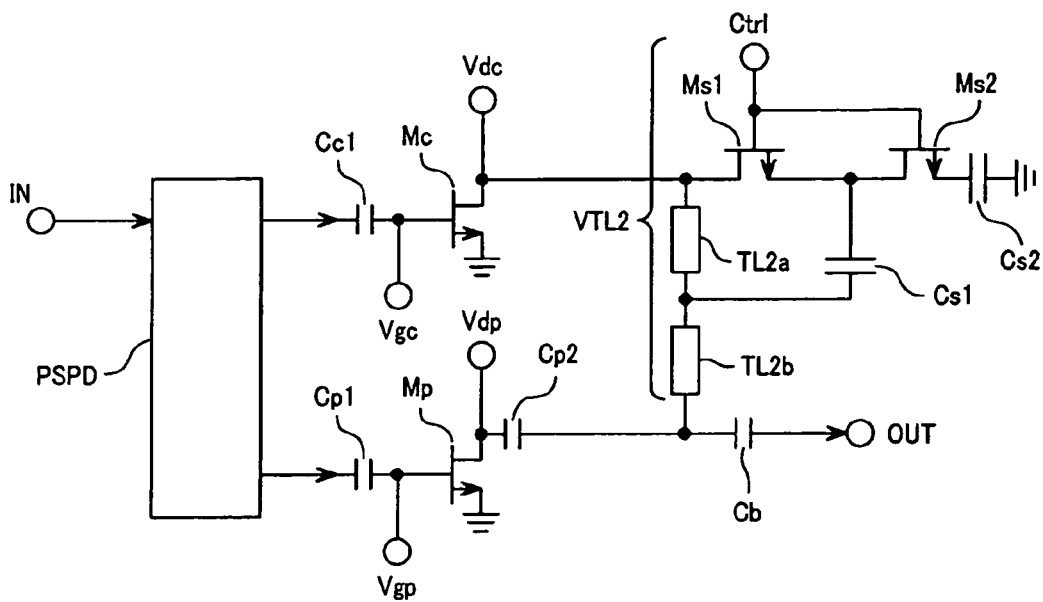
FIG. 7 is a circuit diagram of a Doherty type amplifier of a second embodiment of the present invention.

FIG. 7 is a circuit diagram of a Doherty type amplifier of the second embodiment of the present invention.

In the second embodiment, the switches of the first embodiment are replaced with FET elements, respectively.

The carrier amplifier Amp1 of the Doherty type amplifier of the second embodiment of the present invention, as shown in FIG. 7, is constituted by an FET element Mc and a dc-block capacitor Cc1. A drain terminal, a source terminal, and a gate terminal of the FET element Mc are connected to a power source voltage terminal Vdc, a ground, and a bias voltage terminal Vgc, respectively. The dc-block capacitor Cc1 is connected between the 90-degree phase-shift power divider PSPD and the gate terminal of the FET element Mc.

The peak amplifier Amp2 is constituted by an FET element Mp and a dc-block capacitor Cp1. A drain terminal, a source terminal, and a gate terminal of the FET element Mp are connected to a power source voltage terminal Vdp, the ground, and a bias voltage terminal Vgp, respectively. The dc-block capacitor Cp1 is connected between the 90-degree phase-shift power divider PSPD and the gate terminal of the FET element Mp.

The structure, in which in the variable electric length power combiner VTL2 the first series circuit is constituted by the transmission line TL2a having the length L1a, and the transmission line TL2b having the length L1b, is the same as that in the first embodiment. In the second embodiment, the second series circuit is constituted by an FET element Ms1 and a capacitor Cs1 connected to a source terminal of the FET element Ms1. The third series circuit is constituted by an FET element Ms2 and a capacitor Cs2 having one terminal connected to a source terminal of the FET element Ms2. In this connection, one terminal of the third series circuit is connected to the source terminal of the FET element Ms1, and the other terminal thereof is grounded.

The variable electric length power combiner VLT2 is structured such that a drain terminal of the FET element Ms1 is connected to a node between the carrier amplifier Amp1 and the transmission line TL2a.

In addition, one terminal of a capacitor Cp2 is connected to a drain terminal of the FET element Mp, and a capacitor Cb is provided between the output terminal OUT and the capacitor Cp2.

When the carrier frequency band is the band A, a control signal Sig1 is applied to the gate terminals of the FET elements Ms1 and Ms2 through the control voltage terminal Ctrl connected to the gate terminals of the FET elements Ms1 and Ms2 so that the FET elements Ms1 and Ms2 are turned OFF. On the other hand, when the carrier frequency band is the band B, the control signal Sig2 is applied to the gate terminals of the FET elements Ms1 and Ms2 so that the FET elements Ms1 and Ms2 are turned ON. Thus, the FET elements Ms1 and Ms2 are turned ON or OFF for operation so that the electric length of the variable electric length power combiner VTL2 becomes nearly 90 degrees in each of the case of the band A and the case of the band B. In this case as well, similarly to the first embodiment, it is assumed that the band A is higher in frequency than the band B. In addition, the FET elements Ms1 and Ms2 have gate lengths and gate widths such that when being in the OFF state, the FET elements Ms1 and Ms2 have large impedances with which a current is hardly caused to flow through the second series circuit, while when being in the ON state, the FET elements Ms1 and Ms2 have sufficiently small high-frequency impedances between the drain terminals and the source terminals thereof, respectively. In the circuit shown in FIG. 7, the bias conditions must be set so that the FET element Mc functions as the carrier amplifier and the FET element Mp functions as the peak amplifier. The details thereof are the same as those described with reference to FIG. 18.

It should be noted that the switching FET elements Ms1 and Ms2 in the second embodiment are not limited to the specific case where they are structured in the form of single FET elements, respectively. That is to say, the switching FET elements Ms1 and Ms2 may be structured in the form of single FET elements, respectively, as described above. Alternatively, one or both of the switching FET elements Ms1 and Ms2 may be structured in the form of a cascade connection circuit having a plurality of FET elements or a T type connection switching circuit. When each of the switching FET elements Ms1 and Ms2 is structured in the form of circuits having a plurality of FET elements, enhancement of isolation characteristics of the switches, and relaxation of minimum breakdown voltage characteristics required for each FET element constituting the circuit can be expected as compared with the case where the switching FET elements Ms1 and Ms2 are structured in the form of single FET elements, respectively.

According to the second embodiment, the switches Sw1 and Sw2 shown in FIG. 3 are constituted by the switching FET elements Ms1 and Ms2, respectively, whereby the switching in structure of the variable electric length power combiner VTL2 between the bands A and B can be realized with the high isolation characteristics. As a result, the electric length and the characteristic impedance in the case of the band A can be made to more precisely match those in the case of the band B, respectively. In addition, the carrier amplifier Amp1 and the peak amplifier Amp2 are constituted by the FET elements Mc and Mp, respectively, whereby when mismatching is caused in output matching circuits (not shown) which are provided between the variable electric length power combiner VTL2 and the carrier amplifier Amp1 and between the variable electric length power combiner VTL2 and the peak amplifier Amp2, respectively, the breakdown of the power amplifying elements can be avoided from the characteristics of the FET in which the generation of thermo-runaway is relatively suppressed. In other words, the precision required for the output matching circuit can be relaxed to increase the yield.

Third Embodiment

Next, a third embodiment according to the present invention will be described in detail with reference to FIG. 8.

Figure 8:
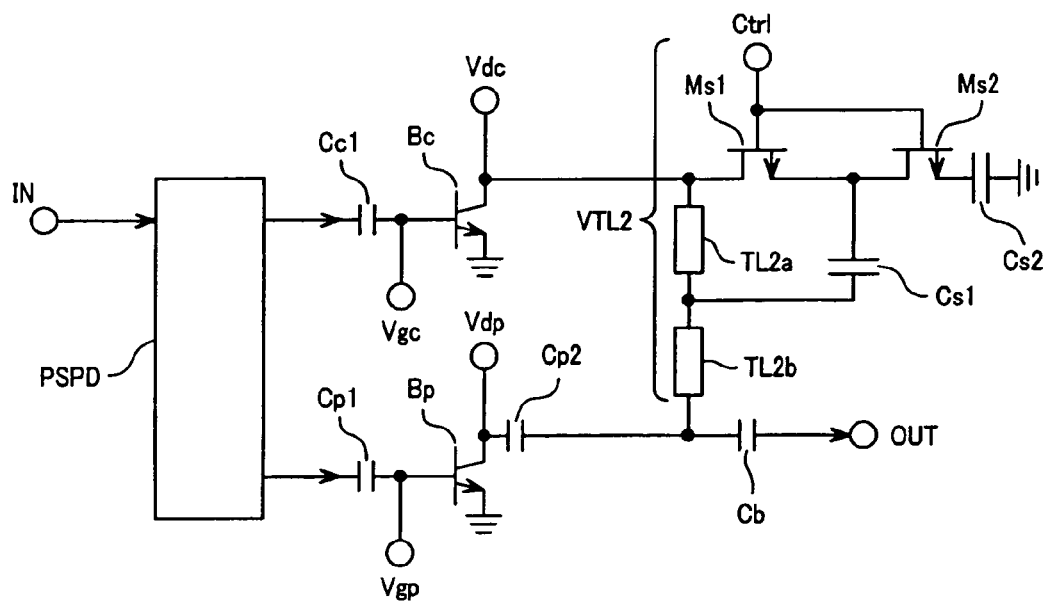
FIG. 8 is a circuit diagram of a Doherty type amplifier of a third embodiment of the present invention.

FIG. 8 is a circuit diagram of a Doherty type amplifier of the third embodiment of the present invention.

In the third embodiment, the carrier amplifier Amp1 and the peak amplifier Amp2 of the second embodiment are constituted by bipolar elements instead of FET elements.

The carrier amplifier Amp1 of the third embodiment, as shown in FIG. 8, is constituted by a bipolar element Bc and the dc-block capacitor Cc1. A collector terminal, an emitter terminal, and a base terminal of the bipolar element Bc are connected to a power source voltage terminal Vdc, a ground, and a bias voltage terminal Vgc, respectively. The dc-block capacitor Cc1 is connected between the 90-degree phase-shift power divider PSPD and the base terminal of the bipolar element Bc.

The peak amplifier Amp2 is constituted by a bipolar element Bp and a dc-block capacitor Cp1. A collector terminal, an emitter terminal, and a base terminal of the bipolar element Bp are connected to a power source voltage terminal Vdp, the ground, and a bias voltage terminal Vgp, respectively. The dc-block capacitor Cp1 is connected between the 90-degree phase-shift power divider PSPD and the base terminal of the bipolar element Bp.

The structures and operations of the output side of the carrier amplifier Amp1 and the peak amplifier Amp2 are the same as those in the case of the second embodiment. In addition, in the circuit shown in FIG. 7, the bias conditions are set so that the bipolar element Bc functions as the carrier amplifier, and the bipolar element Bp functions as the peak amplifier. However, the details thereof are the same as those described with reference to FIG. 18.

It should be noted that the switching FET elements Ms1 and Ms2 in the third embodiment are not limited to the specific case where they are structured in the form of single FET elements, respectively. That is to say, the switching FET elements Ms1 and Ms2 may be structured in the form of single FET elements, respectively, as described above. Alternatively, one or both of the switching FET elements Ms1 and Ms2 may be structured in the form of a cascade connection circuit having a plurality of FET elements or a T type connection switching circuit. When each of the switching FET elements Ms1 and Ms2 is structured in the form of circuits having a plurality of FET elements, enhancement of isolation characteristics of the switches, and relaxation of minimum breakdown voltage characteristics required for each FET element constituting the circuit can be expected as compared with the case where the switching FET elements Ms1 and Ms2 are structured in the form of single FET elements, respectively.

According to the third embodiment, the switches Sw1 and Sw2 shown in FIG. 3 are constituted by the switching FET elements Ms1 and Ms2, respectively, whereby the switching in structure of the variable electric length power combiner VTL2 between the bands A and B can be realized with high isolation characteristics. As a result, the electric length and the characteristic impedance in the case of the band A can be made to precisely match those in the case of the band B, respectively. In addition, the carrier amplifier Amp1 and the peak amplifier Amp2 are constituted by the bipolar elements Bc and Bp, respectively, whereby input matching circuits (not shown) which are provided between the 90-degree phase-shift power divider PSPD and the carrier amplifier Amp1, and between the 90-degree phase-shift power divider PSPD and the peak amplifier Amp2, respectively, can be simplified. As a result, it is possible to shrink the circuit area of the overall power amplifier.

Fourth Embodiment

Next, a fourth embodiment according to the present invention will be described in detail with reference to FIG. 9.

Figure 9:
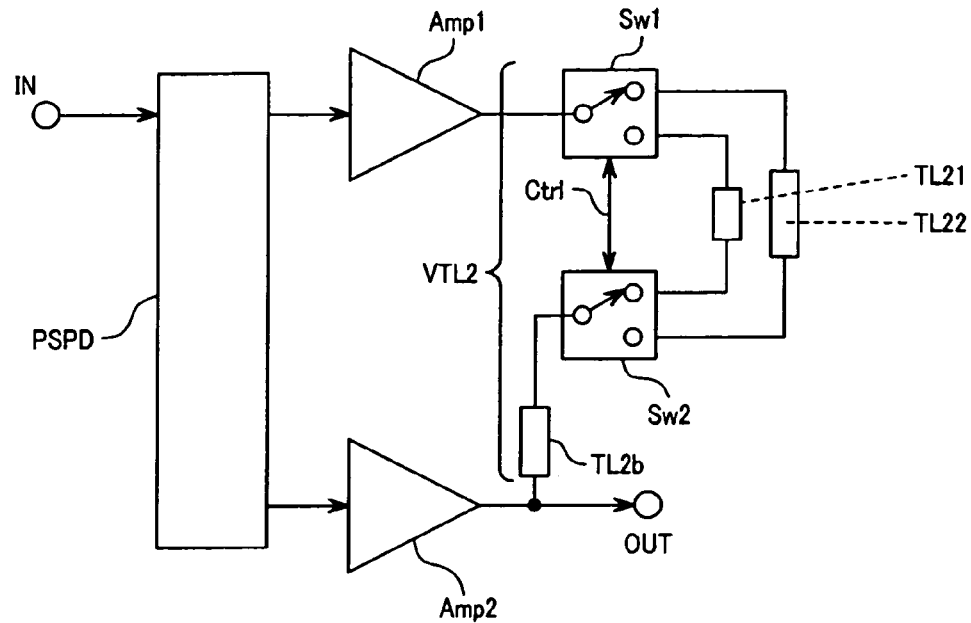
FIG. 9 is a circuit diagram of a Doherty type amplifier of a fourth embodiment of the present invention.

FIG. 9 is a circuit diagram of a Doherty type amplifier of the fourth embodiment according to the present invention.

In the fourth embodiment, the variable electric length power combiner VLT2 is realized by switching between two or more transmission lines. The carrier amplifier Amp1, the peak amplifier Amp2, and the 90-degree phase delay divider part PSPD are the same as those in the outline described with reference to FIG. 1.

In the variable electric length power combiner VLT2, as shown in FIG. 9, two or more transmission lines TL21, TL22, . . . which are connected in parallel with one another are connected in series between the carrier amplifier Amp1 and the transmission line TL2*b* through the selection switches Sw1 and Sw2. As a result, the combined total length of the transmission lines TL21 and TL2*b* becomes a quarter wavelength corresponding to the central frequency of the carrier frequency band A, the combined total length of the transmission lines TL22 and TL2*b* becomes a quarter wavelength corresponding to the central frequency of the carrier frequency band B, and so forth. When a signal is intended to be transmitted in the carrier frequency band such as the band A or the band B, the selection switches Sw1 and Sw2 are switched, thereby selecting from among the transmission lines TL21, TL22, . . . for operation, so that the electric length is kept nearest to 90 degrees. Thus, the power added efficiencies in the respective cases are optimized.

According to the fourth embodiment, the electric length and the characteristic impedance of the variable electric length power combiner VTL2 can be maintained nearly constant for the two or more bands. As a result, the power added efficiencies in the respective bands can be optimized.

Fifth Embodiment

Next, a fifth embodiment according to the present invention will be described in detail with reference to FIG. 10.

Figure 10:
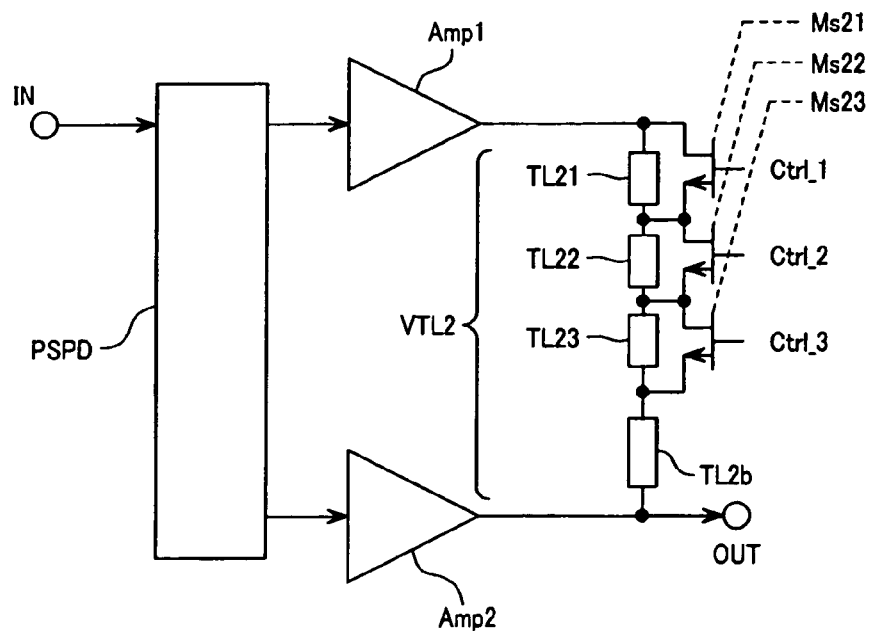
FIG. 10 is a circuit diagram of a Doherty type amplifier of a fifth embodiment of the present invention.

FIG. 10 is a circuit diagram of a Doherty type amplifier of the fifth embodiment according to the present invention.

In the fifth embodiment as well, the variable electric length power combiner VTL2 is realized by switching between two or more transmission lines. However, the fifth embodiment is different in connection method from the fourth embodiment.

In the variable electric length power combiner VTL2 of the fifth embodiment, as shown in FIG. 10, two or more transmission lines TL21, TL22, . . . which have length ratios of 2 to the k-th power (k=1, 2, . . . ) and which are connected in series with one another, and shunt FET elements Ms21, Ms22, . . . which are connected in parallel with each transmission line, respectively. Also, this parallel circuit is connected in series between the carrier amplifier Amp1 and the transmission line TL2b.

Control signals are applied to gate terminals of the shunt FET elements Ms21, Ms22, . . . through control terminals Ctrl1, Ctrl2, . . . to turn ON or OFF the shunt FET elements Ms21, Ms22, . . . . Thus, the electric length between the output terminals of the carrier amplifier Amp1 and the peak amplifier Amp2 may be kept nearest to 90 degrees in correspondence to the carrier frequency. As a result, the power added efficiencies in the respective cases are optimized. For example, the length ratios of the transmission lines TL21, TL22, and TL23 are 1:2:4. Control signals are applied to the control terminals Ctrl1, Ctrl2, and Ctrl3 to turn ON or OFF the shunt FET elements Ms21, Ms22, and Ms23. As a result, the electric length between the output terminals of the carrier amplifier Amp1 and the peak amplifier Amp2 is kept nearest to 90 degrees in correspondence to the carrier frequency.

According to the fifth embodiment, the electric length and the characteristic impedance of the variable electric length power combiner VTL2 can be maintained nearly constant for the two or more bands. As a result, the power added efficiencies in the respective bands can be optimized.

Sixth Embodiment

Next, a sixth embodiment according to the present invention will be described in detail with reference to FIG. 11.

Figure 11:
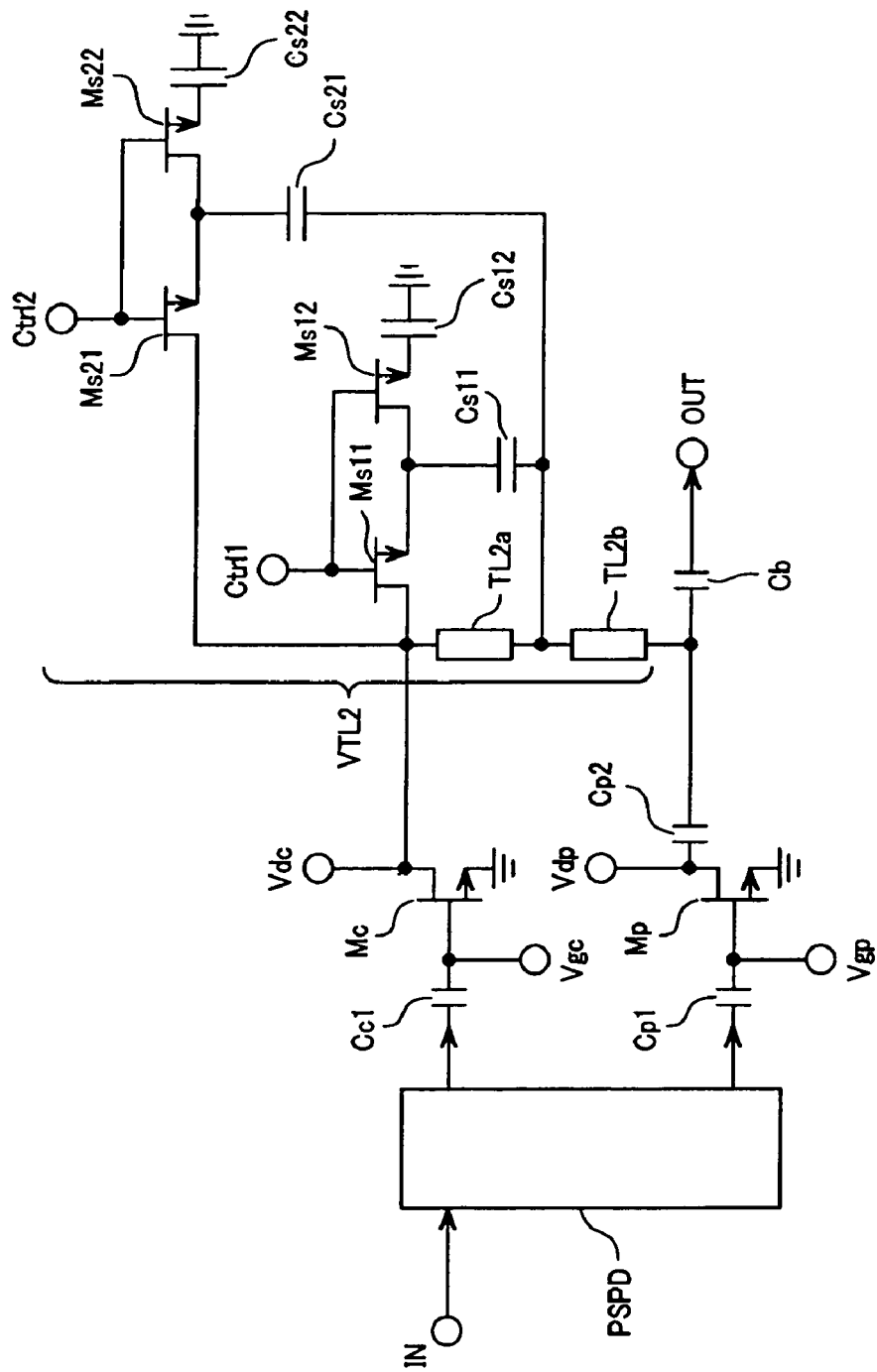
FIG. 11 is a circuit diagram of a Doherty type amplifier of a sixth embodiment of the present invention.

FIG. 11 is a circuit diagram of a Doherty type amplifier of the sixth embodiment according to the present invention.

In the sixth embodiment, similarly to the second embodiment shown in FIG. 7, the amplifier parts and the switches are constituted by FET elements. However, the sixth embodiment is different from the second embodiment in that it has two control terminals for the switches.

The carrier amplifier Amp1 and the peak amplifier Amp2 of the sixth embodiment have the same structures as those of the second embodiment.

The variable electric length power combiner VTL2 of the Doherty type amplifier of the sixth embodiment, as shown in FIG. 11, has a first series circuit having the transmission lines TL2a and TL2b connected in series with each other, a first switching circuit, and a second switching circuit. Also, the first switching circuit and the second switching circuit are connected in parallel between both the ends of the transmission line TL2a.

The first switching circuit has a second-a series circuit including an FET element Ms11, and a capacitor Cs11 having one terminal connected to a source terminal of the FET element Ms11, and a third-a series circuit including an FET element Ms12 and a capacitor Cs12. One terminal of the third-a series circuit is connected to a node between the FET element Ms11 and the capacitor Cs11, and the other terminal thereof is grounded. Also, the second-a series circuit and the transmission line TL2a are connected in parallel with each other, and a drain terminal of the FET element Ms11 is connected to a node between the carrier amplifier Amp1 and the transmission line TL2a.

The second switching circuit includes a second-b series circuit including an FET element Ms21, and a capacitor Cs21 having one terminal connected to a source terminal of the FET element Ms21, and a third-b series circuit including an FET element Ms22 and a capacitor Cs22. One terminal of the third-b series circuit is connected to a node between the FET element Ms21 and a capacitor Cs21, and the other terminal thereof is grounded.

Different control signals are applied to the gate terminals of the FET elements Ms11 and Ms12, and the gate terminals of the FET elements Ms21 and Ms22, respectively, through a control voltage terminal Ctrl1 connected to the gate terminals of the FET elements Ms11 and Ms12, and a control voltage terminal Ctrl2 connected to the gate terminals of the FET elements Ms21 and Ms22, respectively. As a result, by simple switching operations the electric length of the variable electric length power combiner VTL2 is kept nearest to 90 degrees for the corresponding carrier frequency.

In the circuit shown in FIG. 11, the bias conditions are set so that the FET element Mc functions as the carrier amplifier, and the FET element Mp functions as the peak amplifier. The details thereof are the same as those of the second embodiment.

According to the sixth embodiment, the Doherty type amplifier has two mutually independent control terminals Ctrl1 and Ctrl2 for ON/OFF control for the switches. Hence, two kinds of circuit structures are realized with the control terminal Ctrl1, and two kinds of circuit structures are further realized with each of the two kinds of circuit structures. Thus, four kinds of circuit structures in total can be realized. As a result, the electric length and the characteristic impedance of the variable electric length power combiner VTL2 can be maintained nearly constant for the transmission signal of four different frequency bands. Thus, high efficiency can be realized for the amplification of the transmission signal having a multi-band, especially, the quad band.

Seventh Embodiment

Next, a seventh embodiment according to the present invention will be described with reference to FIG. 12.

Figure 12:
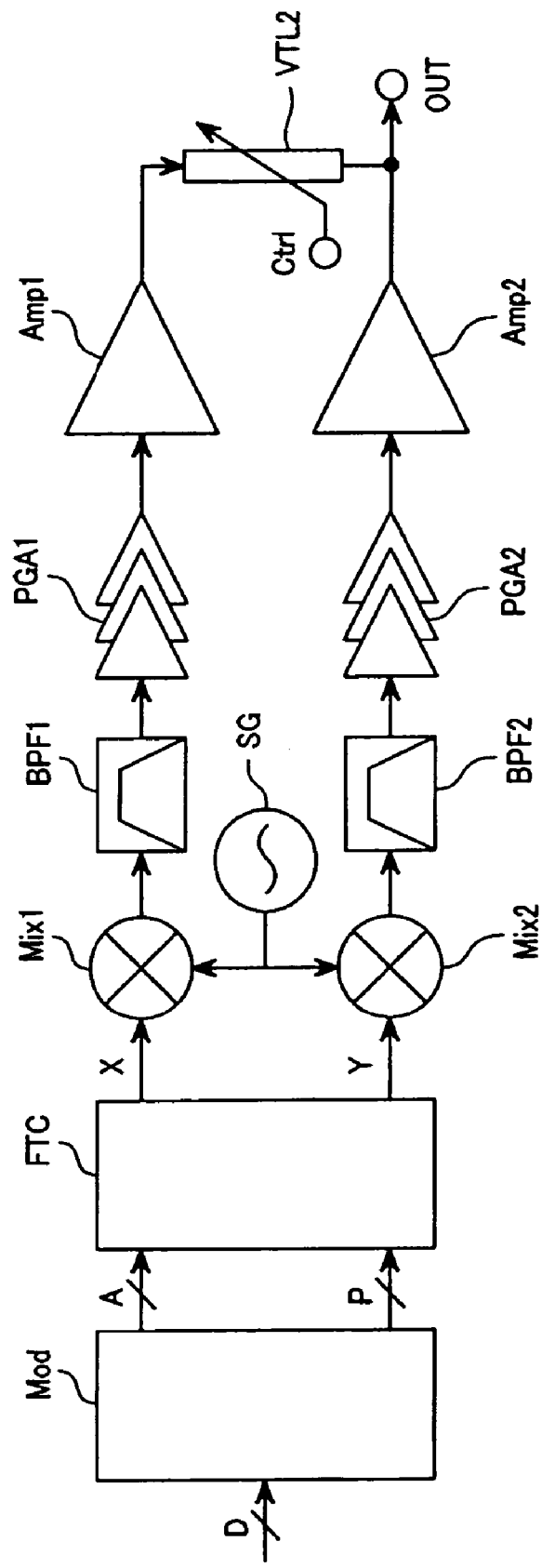
FIG. 12 is a circuit diagram of a transmitter as a seventh embodiment of the present invention.

FIG. 12 is a circuit diagram of a transmitter as a seventh embodiment according to the present invention.

The seventh embodiment shows an example of a transmitter which is realized by incorporating the 90-degree phase-shift power divider PSPD in a transmitter circuit in a pre-processing stage before an output power amplifier.

In the seventh embodiment, the transmitter includes a modulating part Mod, a time signal converting part FTC, and an X signal path and a Y signal path on the input side of the carrier amplifier Amp1 and the peak amplifier Amp2 which are grounded in parallel. In this connection, the modulating part Mod modulates a transmission signal D of a plurality of sub-channels into an amplitude signal A and a phase signal P. The time signal converting part FTC converts the amplitude signal A and the phase signal P into time base signals X and Y between which there is a phase difference of 90 degrees. Also, the X signal path and the Y signal path convert the time base signals X and Y to a signal centered about a carrier frequency. The X signal is constituted by a series circuit including a mixer Mix1 for performing frequency conversion, a band-pass filter BPF1 for suppressing spurious higher harmonic frequency components, and a variable gain amplifier PGA1 for amplifying a level of its input signal up to a necessary output level. The Y signal path is constituted by a series circuit including a mixer Mix2 for performing frequency conversion, a band-pass filter BPF2 for suppressing spurious higher harmonic frequency components, and a variable gain amplifier PGA2 for amplifying a level of its input signal up to a necessary output level. The circuit provided on the input side of the carrier amplifier Amp1 and the peak amplifier Amp2 realizes the same function as that of the 90-degree phase-shift power divider PSPD. During amplification, the transmitter generates a 90-degree phase difference transmission signal centered about a wanted carrier frequency through the modulating part Mod, the time signal converting part FTC, and the X signal path and Y signal path, and inputs the resulting 90-degree phase-different transmission signals to the carrier amplifier Amp1 and the peak amplifier Amp2, respectively. The electric length of the variable electric length power combiner VTL2 is adjusted nearest to 90 degrees for the wanted carrier frequency. As a result, the power-added efficiency is optimized for the wanted carrier frequency.

According to the seventh embodiment, when generating the 90-degree phase difference transmission signal with the general functions such as modulation and frequency conversion and inputting the resulting 90-degree phase difference transmission signal to the carrier amplifier Amp1 and the peak amplifier Amp2, respectively, the transmitter can realize the same functions as those of the 90-degree phase-shift power divider PSPD. As a result, an area which the 90-degree phase-shift power divider PSPD occupies can be omitted, and also power-added efficiency can be optimized for the broad band.

Eighth Embodiment

Next, an eighth embodiment according to the present invention will be described in detail with reference to FIG. 13.

Figure 13:
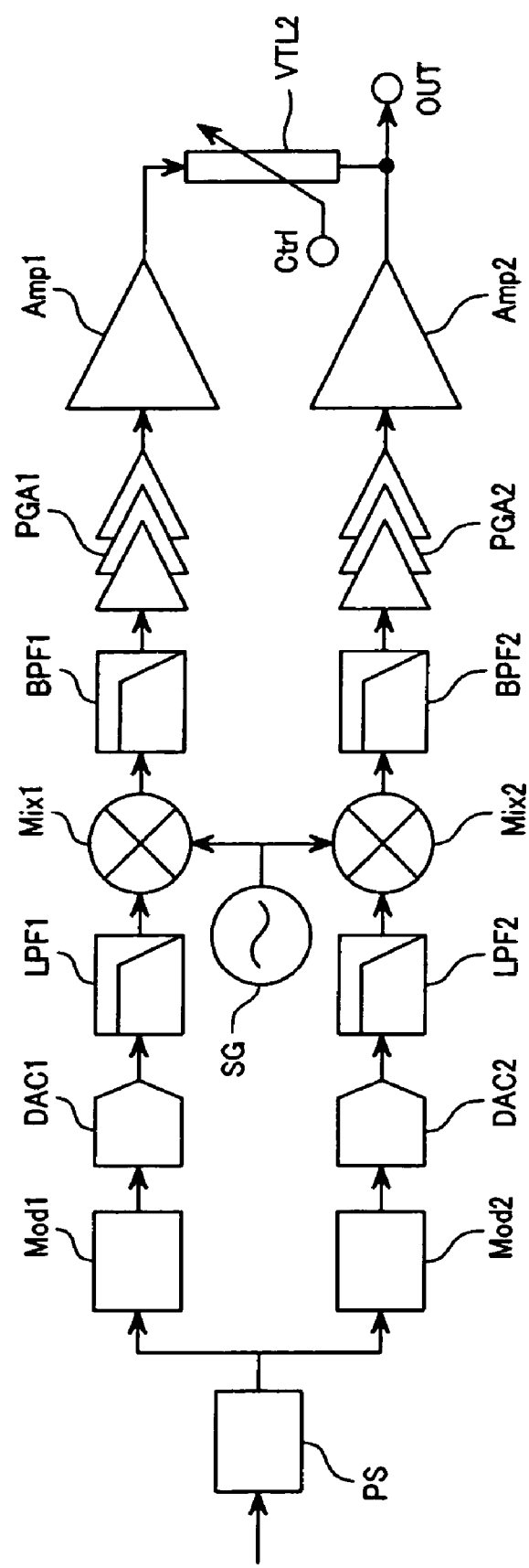
FIG. 13 is a circuit diagram of a transmitter as an eighth embodiment of the present invention.
Figure 14:
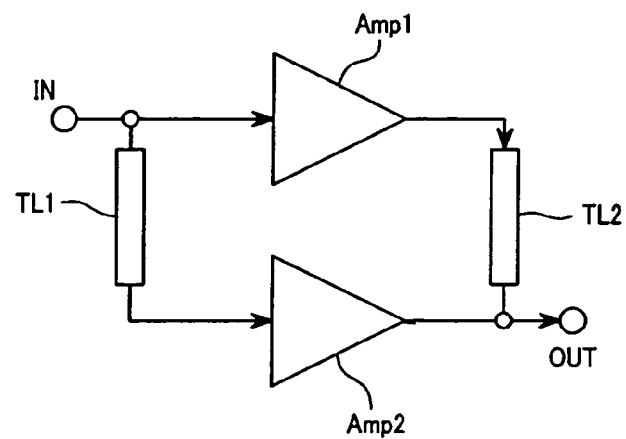
FIG. 14 is a circuit diagram showing a structure of a Doherty type amplifier according to the prior art.
Figure 15:
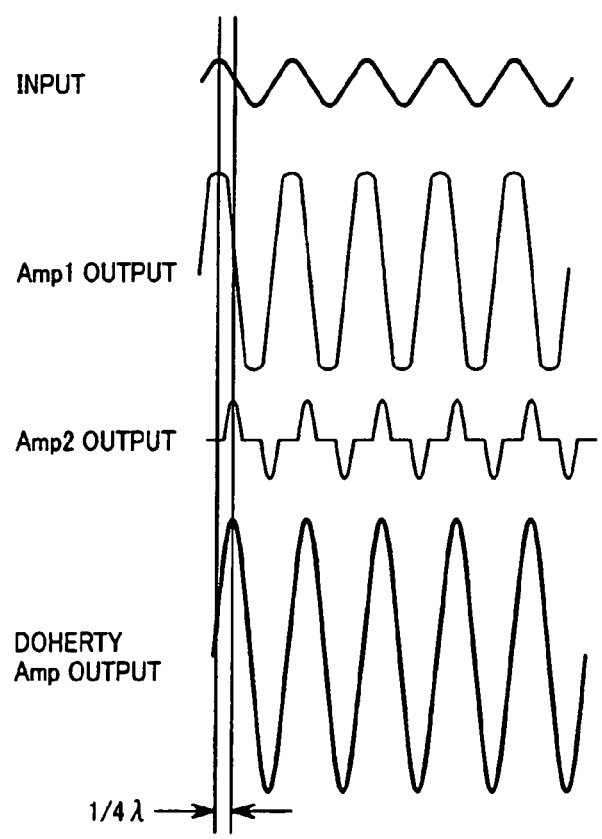
FIG. 15 shows waveforms of signals in the Doherty type amplifier.
Figure 16:
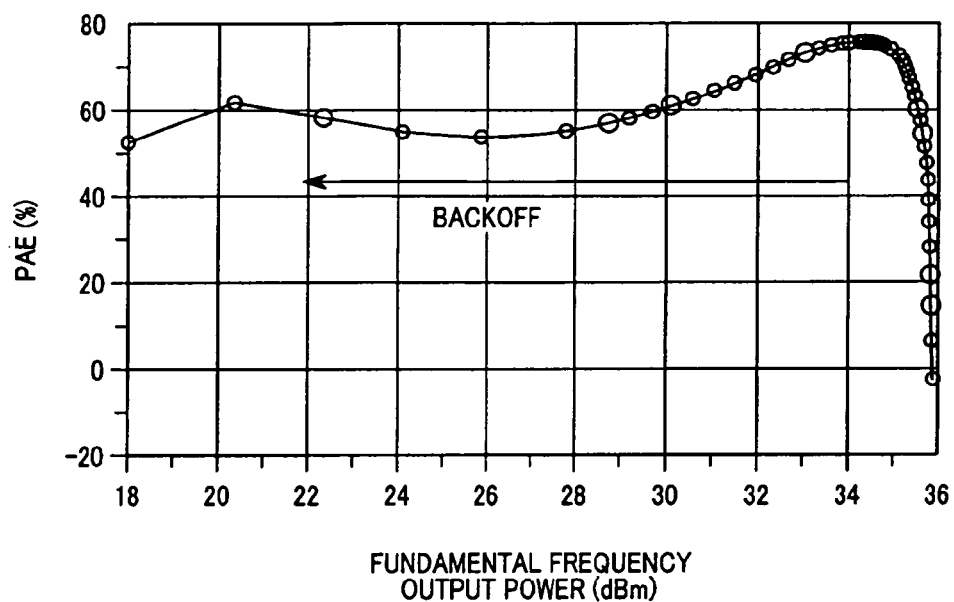
FIG. 16 is a graphical representation showing a relationship between output power range and power added efficiency (PAE) in simulation results of the Doherty type amplifier.
Figure 17:
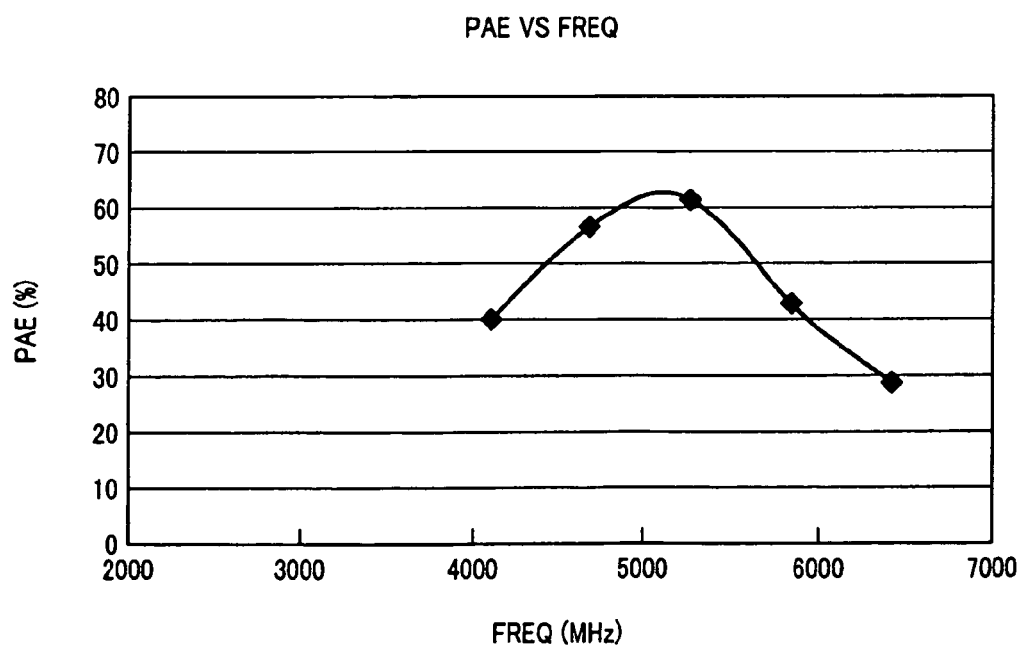
FIG. 17 is a graphical representation showing a relationship between frequency and power added efficiency (PAE) in simulation results for the Doherty type amplifier.

FIG. 13 is a circuit diagram of a transmitter as an eighth embodiment according to the present invention.

In the eighth embodiment, the 90-degree phase-shift power divider PSPD on the input side of the carrier amplifier Amp1 and the peak amplifier Amp2 is realized by a circuit in a pre-processing stage before the output power amplifier.

In the eighth embodiment, the transmitter includes a communication preprocessing block PS, and two paths, i.e., an X signal path constituted by a series circuit including a modulating circuit Mod1, a digital-to-analog converter DAC1, a low-pass filter LPF1, a mixer Mix1, a band-pass filter BPF1, and a variable gain amplifier PGA1, and a Y signal path constituted by a series circuit including a modulating circuit Mod2, a digital-to-analog converter DAC2, a low-pass filter LPF2, a mixer Mix2, a band-pass filter BPF2, and a variable gain amplifier PGA2 on an input side of the carrier amplifier Amp1 and the peak amplifier Amp2 which are installed in parallel with each other. In this connection, the modulating circuit Mod1 generates a first modulated intermediate signal having phase delay of 0 degree from a digital signal. The digital-to-analog converter DAC1 converts the first modulated intermediate signal into an analog signal. The low-pass filter LPF1 suppresses spurious higher harmonic frequency components. The mixer Mix1 performs frequency conversion. The band-pass filter BPF1 suppresses leakage of the local oscillator signal and the image signal. Also, the variable gain amplifier PGA1 amplifies the level of the input signal up to a necessary output level. In addition, the modulating circuit Mod2 generates a second modulated intermediate signal having phase delay of 90 degrees from a digital signal. The digital-to-analog converter DAC2 converts the second modulated intermediate signal into an analog signal. The low-pass filter LPF2 suppresses spurious higher harmonic frequency components. The mixer Mix2 performs frequency conversion. The band-pass filter BPF2 suppresses the local oscillator signal and the image signal. Also, the variable gain amplifier PGA2 amplifies the level of the input signal up to a necessary output level. In addition, a local signal source SG for driving the mixers Mix1 and Mix2 is provided.

The circuit functions in the following way. A transmission signal is inputted through an input terminal IN. A carrier signal RFs and a 90-degree phase delay carrier signal RFsq sent through the 90-degree phase-shift power divider PSPD are amplified by the carrier amplifier Amp1 and the peak amplifier Amp2, respectively. Also, a composite output signal which is obtained through composition in the variable electric length power combiner VTL2 is outputted through an output terminal OUT. When the carrier frequency band is the band A, a control signal Sig1 is applied through a control terminal Ctrl1, and adjustment is performed so that the electric length of the variable electric length power combiner VTL2 becomes 90 degrees for the central frequency of the band A. On the other hand, when the carrier frequency band is the band B lower in frequency than the band A, a control signal Sig2 is applied through the control terminal Ctrl, and the adjustment is performed so that the electric length of the variable electric length power combiner VTL2 becomes 90 degrees for the central frequency of the band B. Thus, the PAEs in the respective cases are maximized.

According to the eighth embodiment, the phase-delayed signals between which there is the phase delay of 90 degrees can be precisely generated by the modulating circuits Mod1 and Mod2, respectively, and converted into the signals having the carrier frequencies which are greatly separated by the mixers Mix1 and Mix2, respectively. Hence, the power-added efficiency can be optimized for a broader band. In addition, since the modulators Mod1 and Mod2 are used to realize digital signal processing, they may be applied to a wide variety of modulation systems. As a result, the power-added efficiency can be optimized for a wide range of systems.

What is claimed is:

1. A power amplifier having a parallel combination of a first amplifier for operating irrespective of an amplitude of an input signal to output a signal corresponding to the amplitude of the input signal, and a second amplifier for operating when the amplitude of the input signal is equal to or larger than a threshold to output a signal corresponding to the level of the amplitude of the input signal above the threshold, power-amplifies a signal inputted through an input terminal by said first and second amplifiers, respectively, and outputs an output signal obtained by combining output signals of said first and second amplifiers through an output terminal, said power amplifier comprising:

a 90-degree phase-shift power divider connected to an input side of said first and second amplifiers; and a variable electric length power combiner connected to an output side of said first and second amplifier;

wherein the input signal is inputted through said input terminal, a first carrier signal and a second carrier signal which lags the first carrier signal by a phase difference of 90 degrees are inputted to said first and second amplifiers through the 90-degree phase delay power divider part, and amplified by said first and second amplifiers, respectively, and a composite output signal obtained through combination in said variable electric length power combiner is outputted through said output terminal, and said variable electric length power combiner is controlled in correspondence to a carrier frequency band of the first carrier signal so that an electric length of said variable electric length power combiner becomes nearly 90 degrees for a central frequency of the carrier frequency band.

2. The power amplifier according to claim 1, wherein when the carrier frequency band of the first carrier signal is a band A, said variable electric length power combiner is controlled so that the electric length of said variable electric length power combiner becomes nearly 90 degrees for a central frequency of the band A, and when the carrier frequency band of the first carrier signal is a band B different from the band A, said variable electric length power combiner is controlled so that the electric length of said variable electric length power combiner becomes nearly 90 degrees for a central frequency of the band B.

3. The power amplifier according to claim 2, wherein the band A is a frequency band having the central frequency higher than that of the band B, said variable electric length power combiner comprises:
a first series circuit having first and second transmission lines connected to each other;
a second series circuit including a first switch and a first capacitor;
a third series circuit including a second switch and a second capacitor, having one terminal connected to a node between said first switch and said first capacitor and the other terminal grounded;
said second series circuit and said first transmission line are connected in parallel with each other, and said first switch and said first transmission line are commonly connected to an output node of said first amplifier,
when the carrier frequency band of the first carrier signal is the band A, said first and second switches are turned OFF in accordance with a control signal sent through a control terminal, and said variable electric length power combiner is controlled so that the electric length of said variable electric length power combiner becomes nearly 90 degrees for the central frequency of the band A, and
when the carrier frequency band of the first carrier signal is the band B, said first and second switches are turned ON in accordance with the control signal sent through said control terminal, and said variable electric length power combiner is controlled so that the electric length of said variable electric length power combiner becomes nearly 90 degrees for the central frequency of the band B.

4. The power amplifier according to claim 3, wherein:
said first amplifier comprises a first FET element and a first Dc-block capacitor,
a drain terminal, a source terminal, and a gate terminal of said first FET element are connected to a power source voltage terminal, a ground, and a bias voltage terminal, respectively,
said first Dc-block capacitor is connected between said 90-degree phase delay power divider part and said gate terminal of said first FET element;
said second amplifier comprises a second FET element and a second Dc-block capacitor,
a drain terminal, a source terminal, and a gate terminal of said second FET element are connected to a power source voltage terminal, the ground, and a bias voltage terminal, respectively, said second Dc-block capacitor is connected between said 90-degree phase delay power divider part and said gate terminal of said second FET element;
said second series circuit comprises a first switching FET element and a first capacitor connected to a source terminal of said first switching FET element;
said third series circuit comprises a second switching FET element and a second capacitor connected to a source terminal of said second switching FET element, one terminal of said third series circuit being connected to said source terminal of said first switching FET element, the other terminal thereof being grounded; and
said variable electric length power combiner comprises:
said first switching FET element and said first transmission line, a drain terminal of said first switching FET element and said first transmission lines being commonly connected to an output node of said first amplifier;
a third capacitor connected to a drain terminal of said second FET element; and
a fourth capacitor connected between said output terminal and said third capacitor;
in a case of the band A, a first control signal is applied to gate terminals of said first and second switching FET elements through a control voltage terminal connected to said gate terminals of said first and second switching FET elements so that said first switching FET element and said second switching FET element are turned OFF, and
in a case of the band B, a second control signal different from the first control signal is applied to said gate terminals of said first and second switching FET elements through said control voltage terminal so that said first switching FET element and said second switching FET element are turned ON,
whereby said first switching FET element and said second switching element are switched for operation so that the electric length of said variable electric length power combiner becomes nearly 90 degrees in each of the case of the band A and the case of the band B.

5. The power amplifier according to claim 3, wherein: said first amplifier comprises a first bipolar element and a first Dc-block capacitor,
a collector terminal, an emitter terminal, and a base terminal of said first bipolar element are connected to a power source voltage terminal, a ground, and a bias voltage terminal, respectively,
said first Dc-block capacitor is connected between said 90-degree phase delay power divider part and said base terminal of said first bipolar element;
said second amplifier comprises a second bipolar element and a second Dc-block capacitor,
a collector terminal, an emitter terminal, and a base terminal of said second bipolar element are connected to a power source voltage terminal, the ground, and a bias voltage terminal, respectively,
said second Dc-block capacitor is connected between said 90-degree phase delay power divider part and said base terminal of said second bipolar element;
said second series circuit comprises a first switching FET element and a first capacitor connected to a source terminal of said first switching FET element;
said third series circuit comprises a second switching FET element and a second capacitor connected to a source terminal of said second switching FET element, one terminal of said third series circuit being connected to said source terminal of said first switching FET element, the other terminal of said third series circuit being grounded; and said variable electric length power combiner comprises:

said first switching FET element and said first transmission line, a drain terminal of said first switching FET element and said first transmission line being commonly connected to an output node of said first amplifier;

a third capacitor connected to said collector terminal of said second bipolar element; and a fourth capacitor connected between said output terminal and said third capacitor;

in a case of the band A, a first control signal is applied to gate terminals of said first and second switching FET elements through a control voltage terminal connected to said gate terminals of said first and second switching FET elements so that said first switching FET element and said second switching FET element are turned OFF, and in a case of the band B, a second control signal different from the first control signal is applied to said gate terminals of said first and second switching FET elements through said control voltage terminal so that said first switching FET element and said second switching FET element are turned ON, whereby said first switching FET element and said second switching FET element are switched for operation so that the electric length of said variable electric length power combiner becomes nearly 90 degrees in each of the case of the band A and the case of the band B.

6. The power amplifier according to claim 2, wherein: a plurality of first transmission lines connected in parallel between said first switch and said second switch, said first amplifier and said second transmission line are connected in series with one another, a total length of a first transmission line of said plurality of first transmission lines and said second transmission line is a quarter wavelength corresponding to a central frequency of the band A, a total length of a second transmission line of said plurality of first transmission lines and said second transmission line is a quarter wavelength corresponding to a central frequency of the band B, and when transmission is made with carrier frequency bands of the band A and the band B, respectively, said first switch and said second switch are switched for operation so that an output signal is caused to flow through said first transmission line of said plurality of first transmission lines, and said second transmission line of said plurality of first transmission lines, respectively.

7. The power amplifier according to claim 2, wherein: a length ratio is 2 to a k-th power where k is a integral number equal to or larger than 1, and a plurality of first transmission lines of different said length ratios connected in series with one another are connected in parallel with an identical plurality of shunt FET elements, pairing each transmission line of said plurality of first transmission lines with a shunt FET of said plurality of shunt FET elements, with source terminals and drain terminals of said plurality of shunt FET elements as nodes, respectively, said plurality of first transmission lines are connected in series between an output node of said first amplifier and said second transmission line, a plurality of control signals are applied to gate terminals of said plurality of shunt FET elements, respectively, and said plurality of shunt FET elements are turned ON or OFF for operation so that an electric length between output terminals of said first amplifier and said second amplifier is changed to a value which is nearest to 90 degrees in correspondence to the carrier frequency.

8. The power amplifier according to claim 3, wherein: said first amplifier comprises a first FET element and a first Dc-block capacitor, a drain terminal, a source terminal, and a gate terminal of said first FET element are connected to a power source voltage terminal, a ground, and a bias voltage terminal, respectively, said first Dc-block capacitor is connected between said 90-degree phase delay power combiner and a gate terminal of said first FET element;

said second amplifier comprises a second FET element and a second Dc-block capacitor, a drain terminal, a source terminal, and a gate terminal of said second FET element are connected to a power source voltage terminal, the ground, and a bias voltage terminal, respectively, said second Dc-block capacitor is connected between said 90-degree phase delay power combiner and said gate terminal of said second FET element, said variable electric length power combiner comprises:

a first series circuit having first and second transmission lines connected in series with each other;

a first switching circuit and a second switching circuit;

said first switching circuit and said second switching circuit are connected in parallel between both ends of said first transmission line;

said first switching circuit comprises:

a second series circuit including a first switching FET element and a third capacitor connected to a source terminal of said first switching FET element; and a third series circuit including a second switching FET element and a fourth capacitor, one terminal of said third series circuit being connected to a node between said first switching FET element and said third capacitor, the other terminal thereof being grounded, said second series circuit and said first transmission line are connected in parallel with each other, and a drain terminal of said first switching FET element is connected to a node between said first amplifier and said first transmission line;

said second switching circuit comprises:

a fourth series circuit including a third switching FET element and a fifth capacitor connected to a source terminal of said third switching FET element and a fifth series circuit including a fourth switching FET element and a sixth capacitor, one terminal of said fifth series circuit being connected to a node between said third switching FET element and said fifth capacitor, the other terminal thereof being grounded;

a seventh capacitor connected between a drain terminal of said second FET element and said second transmission line end of said first series circuit; and an eighth capacitor connected between said output terminal and node between said seventh capacitor and said second transmission line;

a plurality of control signals are applied to gate terminals of said first and second switching FET elements, and gate terminals of said third and fourth switching FET elements through a first control voltage terminal connected to said gate terminals of said first and second switching FET elements, and a second control voltage terminal connected to said gate terminals of said third and fourth switching FET elements, whereby said first, second, third and fourth switching FET elements are switched for operation so that the electric length of the variable electric length power combiner becomes nearest to 90 degrees for the carrier frequency.

9. A transmitter, including:

a 90-degree phase delay power divider part, comprising:

a modulating part for modulating a transmission signal of a plurality of sub-channels into an amplitude signal and a phase signal;

a time signal converting part connected to an output side of said modulating part for converting the amplitude signal and the phase signal into a time base signal X and a time base signal Y between which there is a phase difference of 90 degrees, respectively; and an X signal path and a Y signal path for converting frequencies of the time base signal X and the time base signal Y into carrier frequencies, respectively;

a power amplifier connected to an output side of said 90-degree phase delay power divider part; and a variable electric length power combiner connected to an outside of said power amplifier, wherein said power amplifier comprises a parallel combination of a first amplifier for operating irrespective of an amplitude of an input signal to output a signal corresponding to the amplitude of the input signal, having input terminal connected to the output of said X signal path of said 90-degree phase delay power distributing part, and a second amplifier for operating when the amplitude of the input signal is equal to or larger than a threshold to output a signal corresponding to the amplitude of the input signal, having input terminal connected to the output of said Y signal path of said 90-degree phase delay power distributing part, a first carrier signal and a second carrier signal which lags the first carrier signal by a phase difference of 90 degrees inputted from said 90-degree phase delay power divider portion to said first amplifier and said second amplifier, respectively, being power-amplified by said first and second amplifiers, respectively, and an output signal obtained by combining output signals of said first and second amplifiers with said variable electric length power combiner being outputted through an output terminal, said variable electric length power combiner is controlled in correspondence to a carrier frequency band of the first carrier signal so that an electric length of said variable electric length power combiner becomes nearly 90 degrees for a central frequency of the carrier frequency band.

10. The transmitter according to claim 9, wherein said 90-degree phase delay power divider part comprises:

a first signal path in which a communication preprocessing block, a first modulating circuit for generating a first modulated signal having phase delay of 0 degree from a digital signal, a first DA converter for converting the first modulated signal into an analog signal, a first low-pass filter for suppressing spurious higher harmonic frequency components, a first mixer for performing frequency conversion, and a first variable gain amplifier for amplifying a level of its input signal up to a necessary output level are connected in series with one another on an input side of said first amplifier;

a second signal path in which said communication pre-processing block, a second modulating circuit for generating a second modulated signal having phase delay of 90 degrees from a digital signal, a second DA converter for converting the second modulated signal into an analog signal, a second low-pass filter for suppressing spurious higher harmonic frequency components, a second mixer for performing frequency conversion, and a second variable gain amplifier for amplifying a level of its input signal up to a necessary output level are connected in series with one another on an input side of said second amplifier; and a local signal source for driving said first and second mixers; wherein, a 90-degree phase difference signal is generated by the 90-degree delay power divider part through the first signal path and the second signal path, an input signal is inputted through said input terminal, a first carrier signal and a second carrier signal which lags the first carrier signal by a phase difference of 90 degrees which are obtained through said 90-degree delay power divider part are amplified by said first and second amplifiers, respectively, and a composite output signal obtained through composition in said variable electric length power combiner is outputted through said output terminal, and in order that a 90-degree phase difference transmission signal may be generated with a wanted carrier frequency as a center to be inputted to said first and second amplifiers, respectively, said transmitter is controlled for operation by changing a frequency of said local signal source, and by changing the setting of said variable electric length power combiner so that an electric length thereof becomes nearest to 90 degrees.

* * * * *